(12) United States Patent
Klein et al.

(10) Patent No.: US 7,394,570 B2
(45) Date of Patent: Jul. 1, 2008

(54) METHOD AND APPARATUS FOR ELIMINATING SEAMS IN SCREENED IMAGE DATA FOR REPETITIVE PRINTING

(75) Inventors: Thomas Klein, Wolfenbuettel (DE); Nils Kay, Itzehoe (DE); Kim Skovgaard Jensen, Copenhagen N. (DK)

(73) Assignee: Esko-Graphics Imaging GmbH, Itzehoe (DE)

( * ) Notice: Subject to any disclaimer, the term of this patent is extended or adjusted under 35 U.S.C. 154(b) by 908 days.

(21) Appl. No.: 10/442,682

(22) Filed: May 20, 2003

(65) Prior Publication Data

US 2004/0008383 A1 Jan. 15, 2004

Related U.S. Application Data

(60) Provisional application No. 60/383,479, filed on May 24, 2002.

(51) Int. Cl.
 *G06K 15/00* (2006.01)
(52) U.S. Cl. ............... 358/3.06; 358/3.2; 358/1.9; 358/3.07; 358/3.26; 382/282; 382/269; 399/276; 399/176
(58) Field of Classification Search ........... 358/3.06, 358/3.2, 1.9, 3.07, 3.26; 382/282, 269; 399/276, 399/176
 See application file for complete search history.

(56) References Cited

U.S. PATENT DOCUMENTS

| 3,911,480 | A | * | 10/1975 | Brucker | 358/536 |
|---|---|---|---|---|---|
| 4,673,971 | A | * | 6/1987 | Ikuta et al. | 358/534 |
| 5,045,931 | A | * | 9/1991 | Sakamoto | 358/534 |
| 5,055,923 | A | * | 10/1991 | Kitagawa et al. | 358/534 |
| 5,155,599 | A | * | 10/1992 | Delabastita | 358/3.07 |
| 5,402,409 | A | | 3/1995 | Kataoka et al. | 369/124 |
| 5,481,366 | A | * | 1/1996 | Sakamoto | 358/296 |
| 5,535,672 | A | * | 7/1996 | Kuwahara | 101/170 |
| 5,790,273 | A | | 8/1998 | Horfarter | 358/461 |
| 5,810,396 | A | * | 9/1998 | Kurata et al. | 283/93 |
| 5,868,075 | A | | 2/1999 | Kline et al. | 101/467 |

(Continued)

FOREIGN PATENT DOCUMENTS

EP 535987 A2 * 4/1993

(Continued)

OTHER PUBLICATIONS

Patent Abstracts of Japan, vol. 1999, No. 10, Aug. 31, 1999 & JP 11 133620 A (Kaneda Kikai Seisakusho:KK), May 21, 1999.

(Continued)

*Primary Examiner*—Twyler L. Haskins
*Assistant Examiner*—Jacky X Zheng
(74) *Attorney, Agent, or Firm*—Dov Rosenfeld; Inventek

(57) ABSTRACT

A method of modifying screened image data so that there is no visible seam when the image is printed repeatedly in a circumferential direction, for example using a drum output device. One version applicable to images screened using a supercell includes cutting the image so that the image size in the circumferential direction is an integral number of screen supercells. Another version includes displacing halftone dots in a neighborhood of the seam such that the seam is not visible in a repeated print.

27 Claims, 8 Drawing Sheets

U.S. PATENT DOCUMENTS

| | | |
|---|---|---|
| 5,942,745 A * | 8/1999 | Kline et al. ............... 250/208.1 |
| 6,120,951 A * | 9/2000 | Klein et al. ................... 430/30 |
| 6,433,890 B1 * | 8/2002 | Beckett et al. ............... 358/1.9 |
| 6,505,554 B1 * | 1/2003 | Rhein ......................... 101/129 |
| 6,796,234 B1 * | 9/2004 | Busshoff ................. 101/389.1 |
| 6,882,755 B2 * | 4/2005 | Silverstein et al. .......... 382/282 |
| 2001/0038458 A1 | 11/2001 | Klein et al. .................. 358/1.9 |
| 2002/0069980 A1 * | 6/2002 | Floyd .................... 160/370.22 |
| 2002/0148376 A1 * | 10/2002 | Edamitsu et al. ......... 101/463.1 |

FOREIGN PATENT DOCUMENTS

| | | |
|---|---|---|
| EP | 0 558 008 A1 | 9/1993 |
| EP | 0 895 185 A1 | 2/1999 |

OTHER PUBLICATIONS

Patent Abstracts of Japan, vol. 1996, No. 10, Oct. 31, 1996 & JP 08 156438 A (Dainippon Printing Co. Ltd.), Jun. 18, 1996.

Patent Abstracts of Japan, vol. 007, No. 031, Feb. 8, 1983 & JP 57 185199 A (Toppan Printing Co. Ltd.), Nov. 15, 1982.

Patent Abstracts of Japan, vol. 018, No. 362, Jul. 7, 1994 & JP 06 095393 A (Dainippon Screen MFG. Co. Ltd.), Apr. 8, 1994.

* cited by examiner

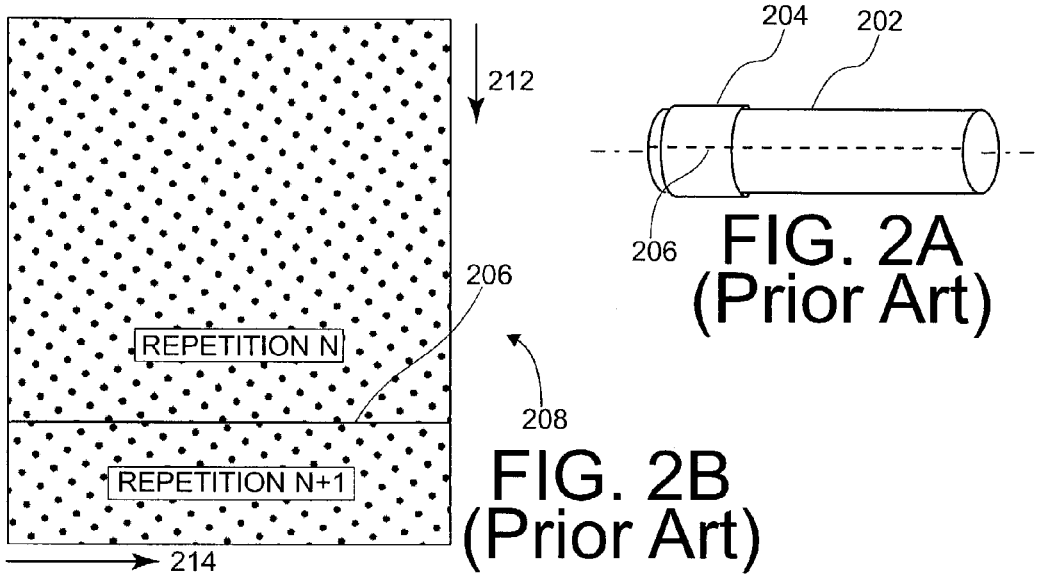
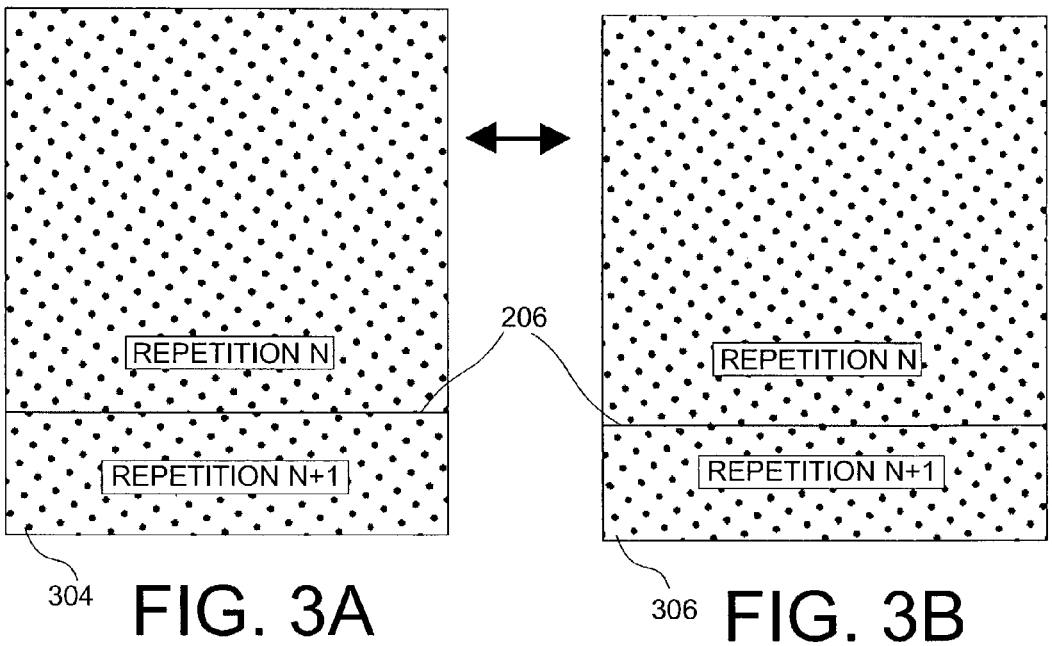

METHOD AND APPARATUS FOR ELIMINATING SEAMS IN SCREENED IMAGE DATA FOR REPETITIVE PRINTING

RELATED U.S. APPLICATION

The present invention contains subject matter related to the subject matter in U.S. patent application Ser. No. 09/801,063 to Klein, et al. titled METHOD AND APPARATUS FOR SEAMLESS IMAGING OF SLEEVES AS USED IN FLEXOGRAPHY, filed 7 Mar. 2001, now U.S. Pat. No. 6,985,261. U.S. patent application No. 09/801,063 is hereby incorporated herein by reference.

The present invention claims benefit of U.S. Provisional Patent Application 60/383,479 filed 24 May 2002 and titled METHOD AND APPARATUS FOR ELIMINATING SEAMS IN SCREENED IMAGE DATA FOR REPETITIVE PRINTING. of U.S. Provisional Patent Application 60/383,479 is also hereby incorporated herein by reference.

BACKGROUND

The invention relates to pre-press, and in particular to preparing data for repetitive imaging of a screened image on a flexographic printing sleeve or roller.

At present, flexography is one of the main printing processes. A flexographic ("flexo") sleeve, normally rubber or photopolymer, is fabricated in such a way that the areas corresponding to zones to be inked are geometrically higher than the areas corresponding to zones not to be inked. Contacting the flexo sleeve with an inking roller, such as an anilox roller, inks the flexo sleeve. Only the geometrically higher zones of the flexo sleeve are inked, other areas are not inked. Subsequently, the inked flexo sleeve is brought in contact with a substrate and the inked parts transfer ink onto the substrate, thus producing the desired image on the substrate.

In flexography, there is demand for printing continuous designs such as wallpaper, decoration and gift wrapping paper. In general, such flexography applications use a cylindrical form, usually a printing sleeve or a cylindrical printing cylinder formed by fusing the edges of a sheet together to form a seamless, continuous element. Such continuous printing elements are well suited for mounting on conventional laser exposing equipment ("imagers") such as the Esko-Graphics Cyrel® Digital Imager (Esko-Graphics, Gent, Belgium) or flexography engravers available from ZED Instruments Ltd. (Hersham, Surrey, England) or Applied Laser Engineering Ltd. (West Molesey, Surrey, England).

Many designs typically need to be screened (halftoned) before being output on an imagesetter or engraver. Screening of separated data is performed using a Raster Image Processor (RIP), that converts the continuous-tone (contone) data of each of a set of color separations into a binary image, e.g., a bitmap by replacing the "gray" values in the original color separation data by screening dots of proper area density. FIG. 1 shows a color separation 100 after screening with an area 102 enlarged so that the screening pattern of screening dots such as dot 104 is visible. Most modern screens are defined by a screen resolution, a screen angle, a line-count (also called screen ruling), and a dot shape. Each of the color separations is thus screened. The characteristics of the different colors' screens are chosen so that they can combine to form a color image having negligible artifacts such as Moire patterns.

For continuous designs, it is desirable to select the screen characteristics so that the screen repeats exactly with the circumference of the sleeve or roller in the fast-scan direction of the imager, e.g., the circumferential direction in the case of a drum imager. The circumferential zero-line position is the line of repetition, i.e., the circumferential position where the imaging commences on the sleeve of the drum, and every circumferential position that is an integral number of rotations away. If the screen does not repeat with the circumference, the mismatch between the screening on the sides of the line of repetition—the circumferential zero-line—results in a visible seam in the print. The circumferential zero-line is thus also called the seam herein. FIG. 2A shows a drum 202 with a sleeve or roller 204 attached. FIG. 2B shows in enlarged form the image 208 on the drum region that includes the circumferential zero line shown as 206. The circumferential direction is shown as the fast-scan direction 212 and the axial direction as is the slow-scan direction 214. As can be seen, unless care is taken, an undesirable mismatch pattern forms at the seam.

Special screens and screening techniques have been developed for continuous printing to prevent the appearance of such a visible seam. However, using such special "seamless" screens may have some limitations. For example, forcing the seamless property may restrict the combinations of line-counts, imaging resolution, and dot shapes that are available. Furthermore, there are many RIPS already installed that are not able to generate such seamless screens. Furthermore, there the separations may include one or more areas of pre-scanned, pre-screened art, and for such art, the screens are pre-determined.

There thus is a need for a method to process a set of already screened separations, at least one of which has a mismatch in the screening pattern along the circumferential zero-axis of the sleeve or roller in order to either eliminate or at least hide the mismatch so that continuous designs may be printed without a visible seam.

SUMMARY

Disclosed herein is a method and an apparatus for processing a screened separation to produce a processed screened separation for continuous imaging on a flexo sleeve or roller such that there is substantially no visible seam in a repeating print of the image.

In one embodiment, the screened file is cut so that the size of the image in the circumferential direction is an integral number of screening supercells. In an improved version, the image is stretched to restore the original image size.

In another embodiment, the screening dots are analyzed in the neighborhood of the circumferential zero line of the sleeve or roller, and slightly displaced to eliminate the mismatch between both screening zones in this area, to eliminate the appearance of a visible seam in a repeating print of the image.

BRIEF DESCRIPTION OF THE DRAWINGS

FIG. 2A shows a drum output device with a sleeve attached.

FIG. 2B shows a screen mismatch along the circumferential zero line of the printing sleeve or roller.

FIG. 3A shows a prescreened separation that includes a mismatch along the circumferential zero-line.

FIG. 3B shows the results of processing the screened image data according to an embodiment of the invention to produce a separation with substantially no mismatch along the circumferential zero-line.

DETAILED DESCRIPTION

Figure 7:
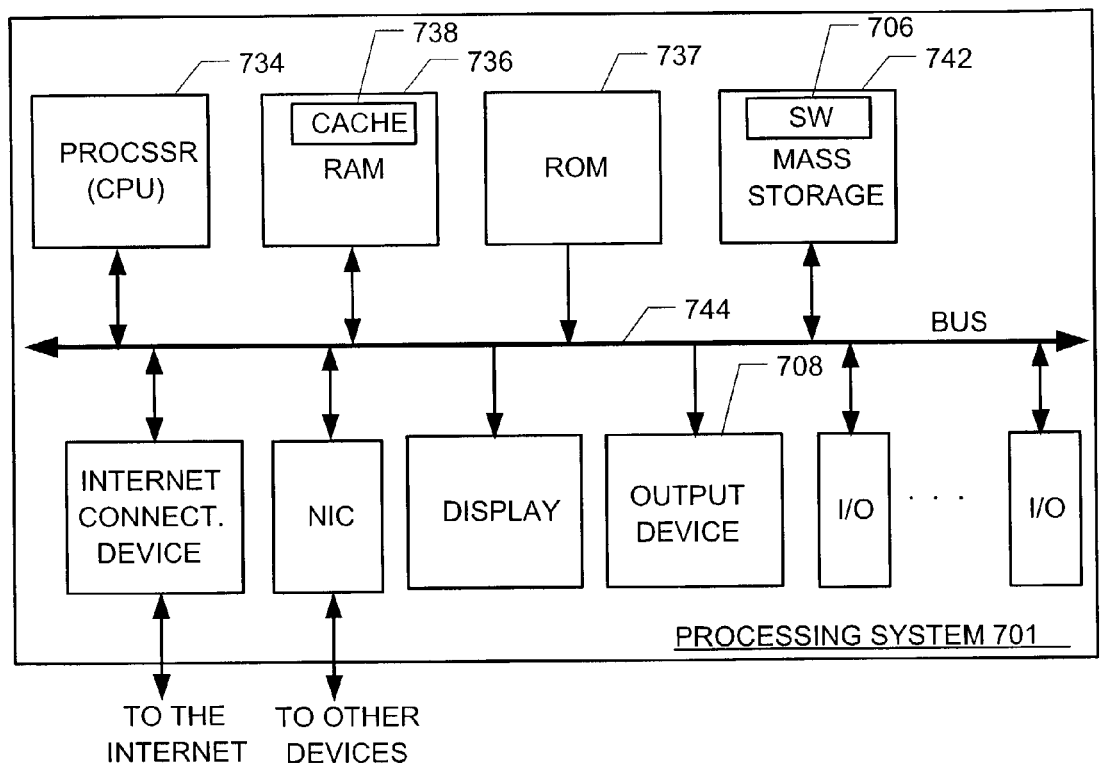
FIG. 7 shows a computer system in which the present invention may be implemented.

Method embodiments of the invention are implemented on a computer system that includes one or more processors, memory, and a storage subsystem. However, alternate embodiments of the invention may be embodied in dedicated devices such as imagesetter controllers. FIG. 7 is a simplified block diagram of a computer system 701 in which method embodiments may be embodied. The computer system includes one or more processors 734, a storage subsystem 742, and a memory subsystem 736 that includes random access read/write memory (RAM), a cache 738, and a read-only memory (ROM) 737. The computer system shown in FIG. 7 includes other elements that communicate via a bus subsystem 744, as is standard. The term "bus subsystem" is used generically to include any mechanism for letting the various components of the system communicate with each other. A computer system such as shown in FIG. 7 is standard, so the drawing is labeled "Prior Art." A computer system such as system 701 suitably programmed to embody one or more aspects of the present invention, however, is not prior art. In one embodiment, the method is provided in the form of a computer program (software 706) that is stored in the storage subsystem 742. That is, a carrier medium is provided that carries one or more computer readable code segments that instruct one or more of the processors 734 to carry out the steps of the inventive method. It is when the software 706 in mass storage 742 instructs the processor(s) 734 to carry out the steps of any of the novel methods described herein where FIG. 7 ceases to be prior-art.

FIG. 3A shows a prescreened separation 304 that includes a mismatch along the circumferential zero-line 206. FIG. 3B shows the results of processing the screened image data by one of the embodiments of the present invention to produce a separation 306 with substantially no mismatch along the circumferential zero-line 206.

Figure 1:
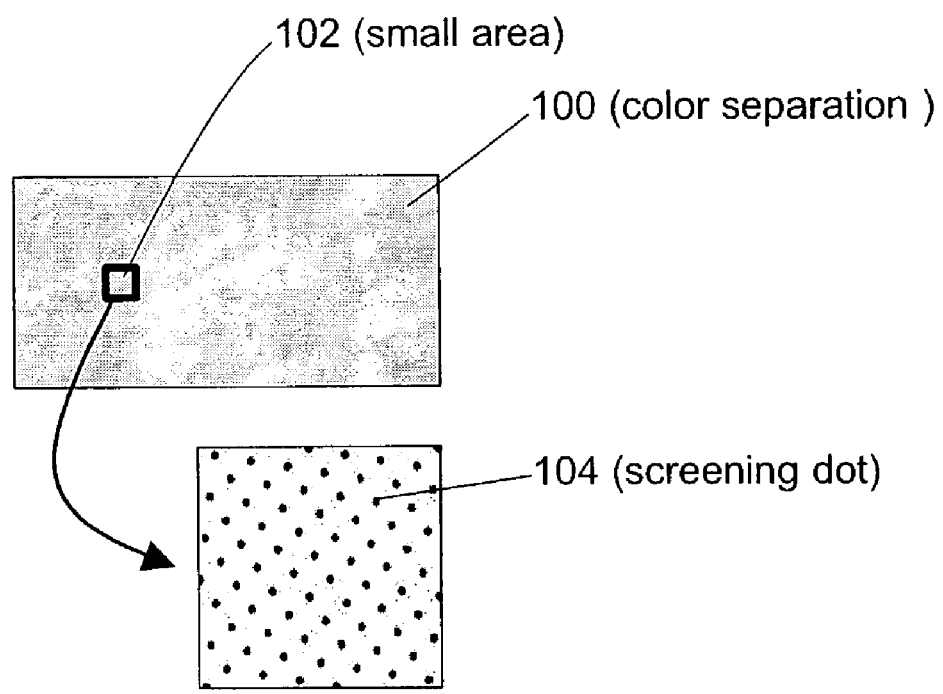
FIG. 1 shows a color separation 100 after screening with an area 102 enlarged so that the screening pattern of screening dots such as dot 104 is visible.
Figure 4:
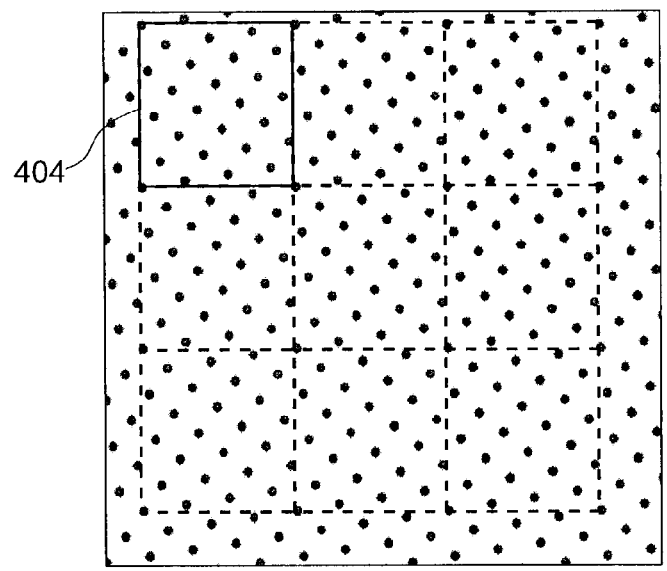
FIG. 4 shows a screened image with tiles of supercells.

Modern screening techniques use threshold arrays, also called supercells. The screening process is equivalent to placing a threshold array over the image. The screening includes comparing the values in the threshold array with the values in the original image beneath the array to determine if the resulting binary data is to be on (printed) or off. The threshold array, also called the supercell, is typically far smaller than the image to be screened, so the threshold array is repeated in two dimensions in order to fill the complete original image. This is sometimes called tiling the supercell. FIG. 4 shows such tiling in an exaggerated manner. Nine supercells are shown, with supercell 404 being one such supercell. Each supercell includes several halftone dots and generates a screened image having a screen ruling, a screen angle, and dots having a dot shape.

A first method embodiment of the invention is applicable to images screened using supercells. The method also is applicable to any screening method that uses repeating cells, so the term "supercell" will be used herein to represent any such repeating cell and how to adapt the description herein to apply to any particular type of repeating cell would be clear to one in the art.

Figure 5A:
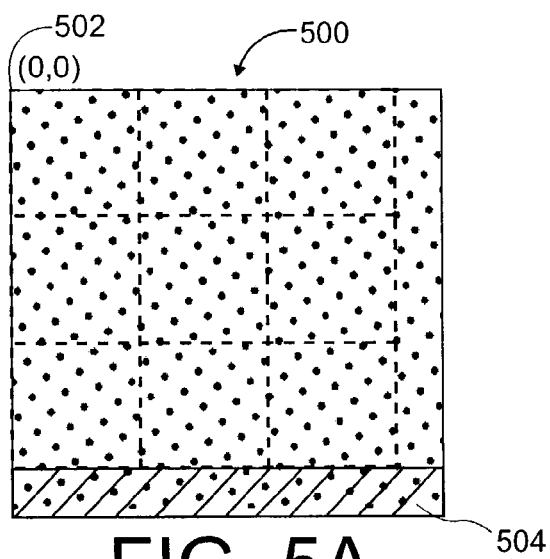
FIG. 5A shows a simple example of a screened image made seamless by a method embodiment of the invention that includes cutting the image so the image length in the circumferential direction is an integral number of supercells.
Figure 8:
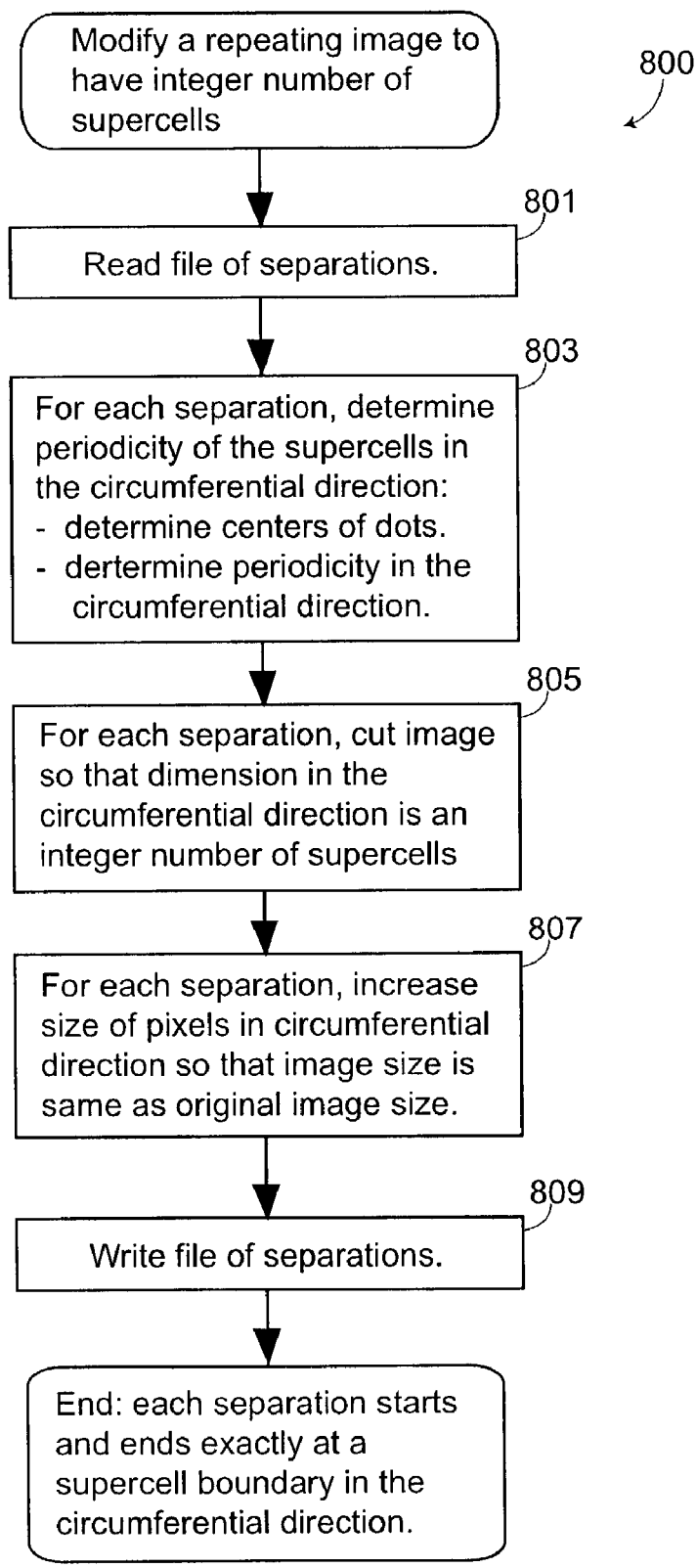
FIG. 8 shows a flowchart of one embodiment of the invention that includes cutting the image length to an integral number of supercells in the circumferential direction.

FIG. 8 shows a flow chart of one embodiment 800. An image to be repeated in the circumferential direction is provided in the form of a file containing a set of one or more color separations. FIG. 5A shows one such separation of the image 500. For the purpose of illustrating the method, the image has an exaggerated screening pattern and includes only three supercells in the circumferential direction. In one embodiment, the processing is carried out separation by separation. In a step 801, the image file is read from storage. In a step 803, each separation in the file of separations is analyzed to find the period of the screening supercell in the circumferential direction. The left upper corner 502 of the image, defined as the zero positions in circumferential and axial directions and denoted (0,0), is arbitrarily set as the start of the supercell. In one embodiment, the analysis to determine the periodicity includes determining the centers of the halftone dots, and then searching for periodicity in the location of the centers in the circumferential direction. In an alternate embodiment, where it is determined that there is a region of approximately uniform gray level in the separation, the periodicity is determined by examining a single scan line in the circumferential direction in the region of approximately uniform gray-level. In step 805, the image is cut at the lowest edge in the circumferential direction so that the image size in the circumferential direction is an integral number of supercells. That is, each separation is cut such the image starts and ends exactly at the boundary of a supercell in the circumferential direction. In FIG. 5A, the region cut is shown as region 504. The final cut image is stored in a step 809, or, in an embodiment that processes images on-the-fly, for example in a controller for a drum imaging device, the image files may be output to the imaging device.

The inventors discovered that in most practical cases, the size of the image is reduced by a relatively small amount, e.g., in the order of about 100 μm in the circumferential direction. This is acceptable for typical flexographic printing applications. The average size cut is one half of a supercell period in the circumferential direction, and the maximum cut is smaller than the size of one supercell in the circumferential direction.

In an alternate embodiment, a step 807 is included in which the original size of the image is restored after cutting by uniformly enlarging the image in the circumferential direction. This may be carried out in one embodiment by enlarging the size of each pixel in the circumferential direction while not changing the number of pixels in that direction.

Figure 5B:
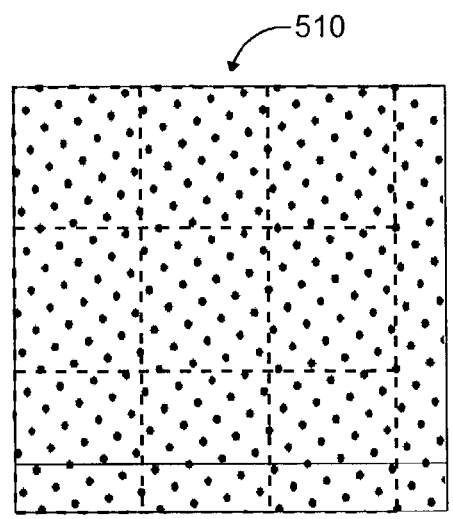
FIG. 5B shows a simple example of the cut image of FIG. 5A stretched to maintain the image size according to an improved embodiment that includes cutting the image.

FIG. 5B shows an image 510 that results from cutting (step 805) and stretching (step 807) the image 500 of FIG. 5A.

In yet another alternate embodiment, instead of stretching the image, the circumference of the sleeve or roller is slightly modified so that the cut image fits.

In yet another alternate embodiment, steps 803 and 805 are repeated in the axial direction. That is, the image data is analyzed to determine the superceilperiod in the axial direction, and the image is also reduced in the axial direction so that the axial dimension of the image is an integral number of supercells. In an another version of the embodiment, step 807 is also repeated in the axial direction, i.e., the image is stretched in the axial direction such that the image size in the axial direction is maintained.

The inventors discovered that while the above described embodiments work well in many cases, there are some cases wherein cutting, even with stretching, does not always produce pleasant results when slanted elements, e.g., lines or scanned images such as photographs are located at the image boundaries in circumferential direction.

Furthermore, there may be other situations where cutting is undesirable. For example, the different separations in a color image file have screens at different screen angles. In some image files, the different separations may also have different supercell sizes, so that each of the separations may have a different amount cut in step 805, and thus, in step 807, each separation may end up having a different pixel size. While this should not be a problem in general, in some cases, there may be undesirable effects. Thus, the inventors also investigated embodiments that avoid cutting.

A second method embodiment of the invention includes modifying the position of individual screening dots to eliminate the screening mismatch between upper and lower edge of the image, i.e., at the seam. In addition, in one version, the halftone dots directly located at the upper and lower edges of the image that are not whole are repaired so that the dot size matches the average gray level of the original (uncut) dot.

Figure 9:
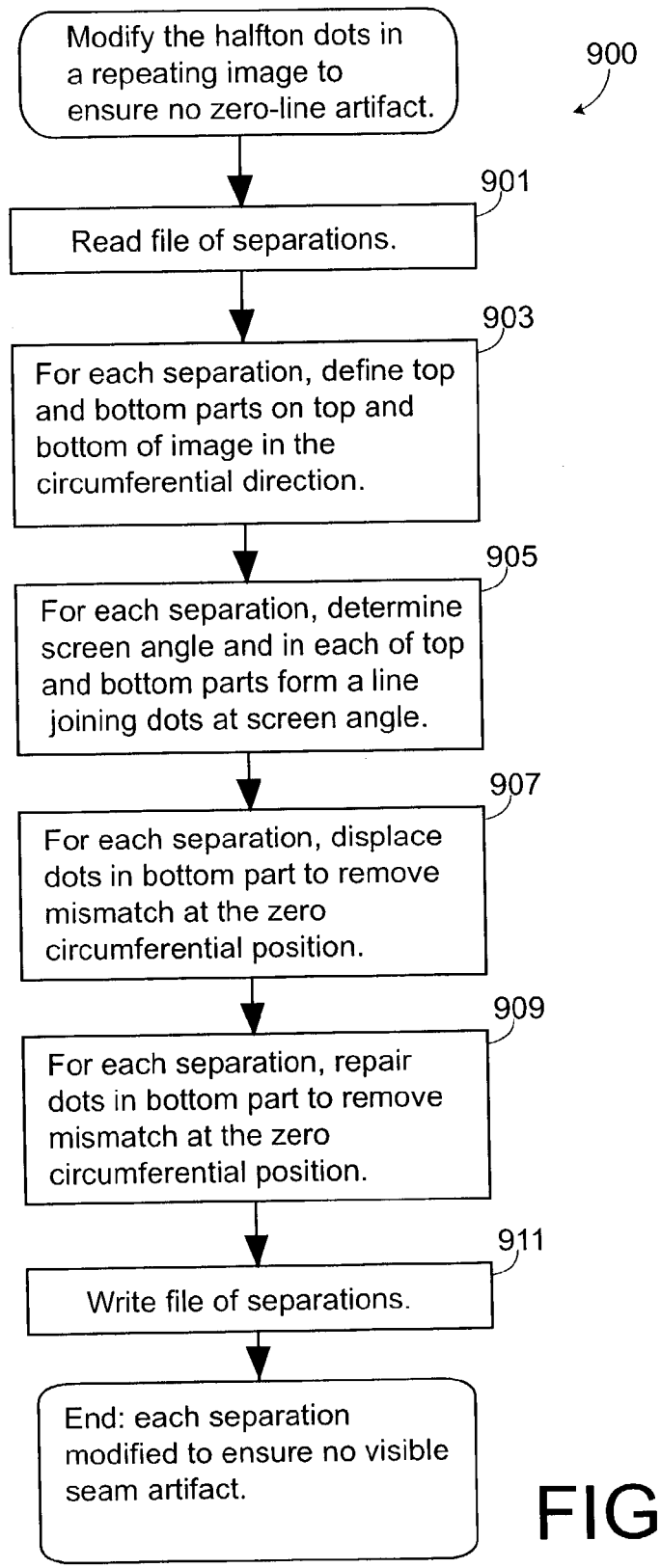
FIG. 9 shows a flowchart of another embodiment of the invention that includes displacing halftone dots in the neighborhood of the seam.

FIG. 9 shows a flowchart of a second method embodiment 900. In a step 901, the image file that includes a set of one or more color separations is read. In a step 903, for each separation, a neighborhood of the circumferential zero-line, i.e., of the seam is selected. In one embodiment, the neighborhood includes a top part (or side part) and a bottom part (or opposite side part) in the neighborhoods of the upper and lower edges (or opposite side edges) of the image, respectively. For the remainder of the description, top to bottom is assumed to be in a circumferential direction when the image is imaged on a drum. In one embodiment, the height in the circumferential direction of each area of the neighborhood is selected to be approximately ten times the average distance between the centers of two neighboring screening dots, while the width of each neighborhood part is at least the width of the image in the axial direction. While other embodiments may use a different size height, the inventors found that a factor of ten is sufficient to obtain acceptable results.

In a step 905, the center positions of all screening dots in the neighborhood are determined for each separation. For each separation, the angle of the dots, i.e., the screen angle is determined and in each area, a line joining the dots at the determined screen angle is formed.

Figure 6A:
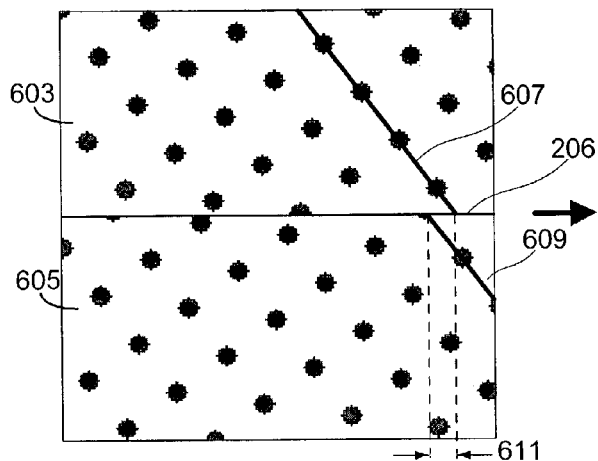
FIG. 6A shows a bottom area and a top area of the next repetition of a repeating screened image.

FIG. 6A shows the bottom neighborhood part 603 of an image and the top neighborhood part 605 of the next repetition of the image. Line 206 is the circumferential zero-line. The line 607 joins the halftone dots in the bottom neighborhood part at the screen angle and the bottom line 609 joins the halftone dots in the top neighborhood part at the screen angle. As can be seen, there is a mismatch of a finite width 611 in the axial direction. Thus, in one embodiment, axial distance 611 is used as a measure of the mismatch.

Figure 6B:
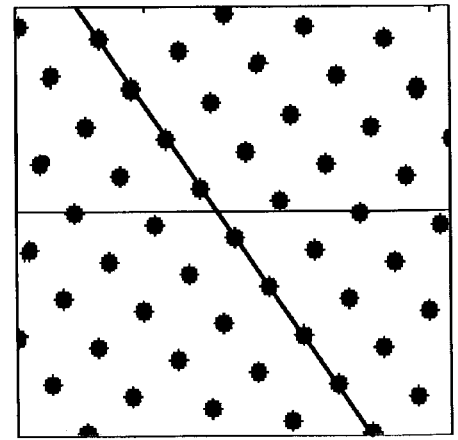
FIG. 6B shows how the image of FIG. 6A can be made seamless by a halftone dot displacement method embodiment of the invention in which the halftone dots in the neighborhood of the seam are properly displaced.
Figure 6C:
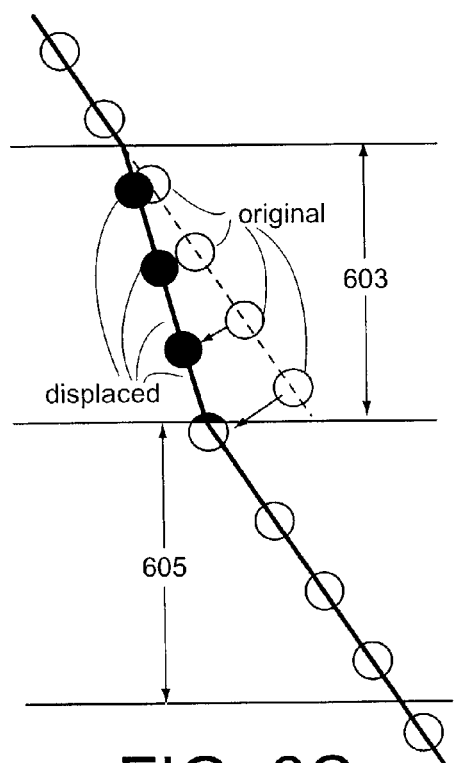
FIG. 6C shows one variation of the halftone dot displacement method.

In a step 907, for each separation, the halftone dots in the bottom neighborhood part 603 are displaced by a relatively small amount such that the line at the screen angle joining the halftone dots in the top neighborhood part meets the line at the screen angle at the bottom neighborhood part at the circumferential zero line and the mismatch is substantially diminished. The result is shown in FIG. 6B in which the measure of mismatch is zero. In one embodiment, the dots are moved in the direction normal to the screen angle in proportion to the circumferential distance from the top of the bottom area, i.e., in inverse proportion to the circumferential distance from the seam. This is shown in FIG. 6C. The positions of the upper screening dots in the selected areas remain fixed in position. One version moving the dots in proportion to the distance corresponds to changing the screen angle in the bottom area near the seam.

Figure 6D:
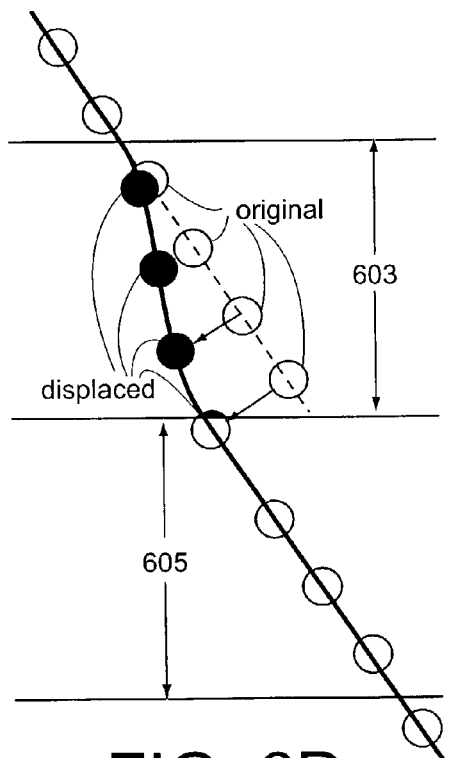
FIG. 6D shows another variation of the halftone dot displacement method.

In another embodiment, the dots are moved in the direction normal to the screen angle such that the line joining the halftone dots retains smoothness, i.e., the gradient of the line has no discontinuities. This is shown in FIG. 6D.

In yet an alternate embodiment, the dots in both parts of the neighborhood are displaced. In one version of such an alternate embodiment, the neighborhood forms substantially the whole image, so that the halftone dot displacement is equivalent to slightly changing the screen angle on the image.

In yet another embodiment, the dot displacement occurs in a significant part of the image. In one version of such an other embodiment, the neighborhood forms substantially the whole image, so that the halftone dot displacement occurs in approximately half the image.

In a step 909, in each separation, dots that were cut are restored to the correct gray value, and dots that are newly cut are reduced in area corresponding to the cut. In one embodiment, those screening dots that previously were completely in the bottom area of the seam neighborhood but that are cut by the bottom edge after displacement are modified to have an area in proportion to the amount remaining. Furthermore, in the embodiment in which halftone dots in the top half also are displaced, some of the dots were previously cut ("partial dots") and now are fully in the top neighborhood part are restored. Pixels are added to such partial dots originally located directly at the upper and lower edges to create a dot of a size that matches the average gray level of dots in a region surrounding the partial dot. For this, the gray level of the region surrounding the partial pixel is determined. The inventors found that a region of 5 screening dots in the circumferential direction by 5 screening dots in the axial direction produces pleasant results. Other embodiments may select a different region size.

The final image is stored in a step 911, or, in an embodiment that processes images on-the-fly, for example in a controller for a drum imaging device, the image files may be output to the imaging device.

Figure 10:
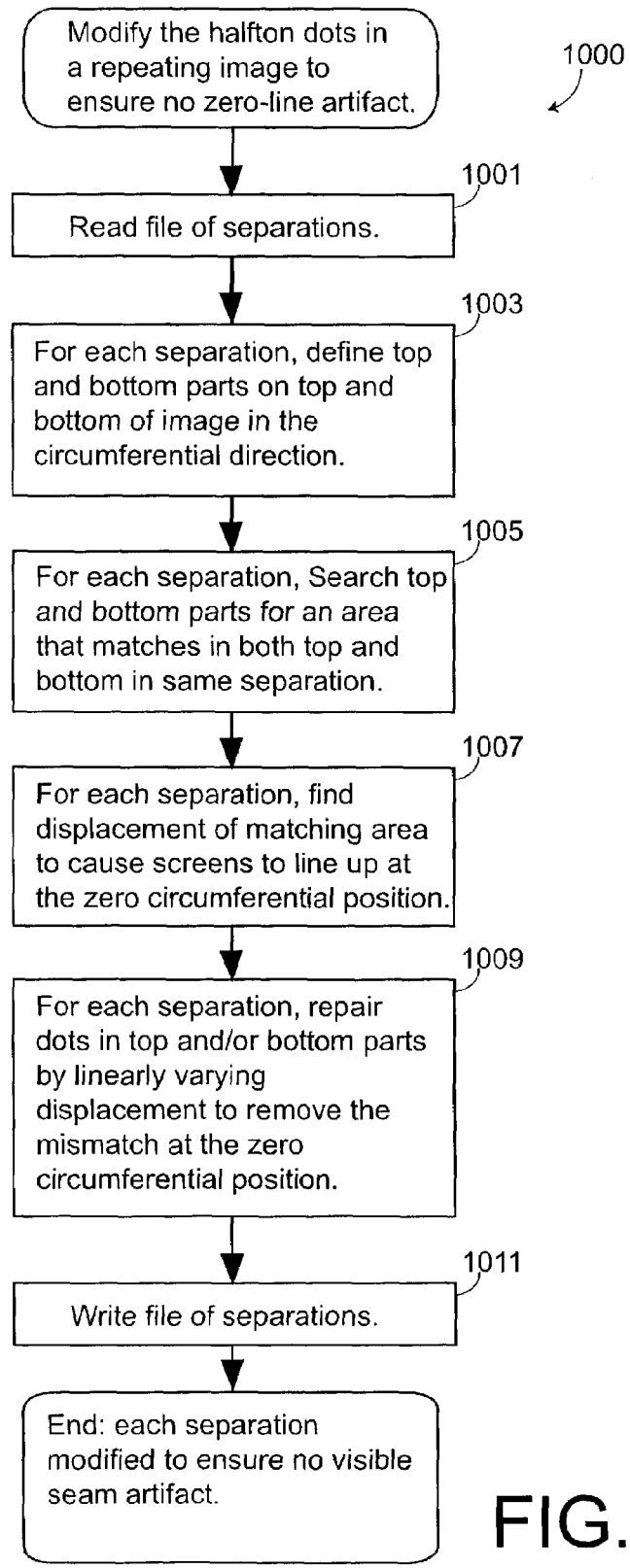
FIG. 10 shows a flowchart of yet another embodiment of the invention that includes displacing halftone dots in the neighborhood of the seam.

FIG. 10 shows a flowchart of another method embodiment 1000. In a step 1001, the image file that includes a set of one or more color separations is read. In a step 1003, for each separation, a neighborhood of the circumferential zero-line, i.e., of the seam is selected. The neighborhood includes a top part and a bottom part in the neighborhoods of the upper and lower edges of the image, respectively. Again, top to bottom is assumed to be in a circumferential direction when the image is imaged on a drum. In one embodiment, the height in the circumferential direction of each neighborhood part is selected to be 128 pixels, while the width of each neighborhood part is at least the width of the image in the axial direction.

In a step 1005, the top and bottom parts of the neighborhood are searched for an area that exists in both top and bottom parts and wherein there is a well-defined halftone screen. As part of step 1005, screen estimation is carried out on the area that exists in both the top and bottom parts, including determining one or more parameters of the screen, such as the screen ruling of the area. The results of such screen estimation in the matched area in the top and bottom parts are averaged. In one embodiment, the area matched for is 128 by 128.

In a step 1007, for each separation, the displacement is determined using the screen ruling found in the screen estimation that would cause the screens to line up at the zero-circumferential position. One embodiment uses a correlation operation on the matching 128 by 128 areas in the top and bottom parts. The correlation includes appropriate windowing and pre-filtering as would be known to those in the art.

In a step 1009, for each separation, the pixels in the top and bottom parts are displaced in the axial direction by an amount linearly dependent on the distance from the zero circumferential position such that the pixels are displaced in total by the displacement found in step 1007 at the zero circumferential line, and not displaced at the opposite end of the top and bottom areas so that there is a match at the zero circumferential position. In another embodiment, the displacement is carried out on the pixels of only one part: the top part or the bottom part.

One version of step 1009 further includes filtering the data in the top and bottom areas (or only in one part in the case that only data in one part was displaced) to smooth the halftone dot shapes and to remove discontinuities at the seam. Another version does not include this smoothing. The inventors have found the smoothing step not necessary in the samples used to test the technique.

Step 1011 writes the data after modification to the file system.

The methods described herein may be implemented by a hardware device that forms a hardware controller for a drum imaging device. One embodiment includes a processing system that carries out the steps of the method. The processing system may be as shown in FIG. 7 or a subset thereof. The apparatus includes means for inputting the image data, e.g., from the storage subsystem 742, and means for outputting the image. In one version, the image is output back to storage, while in another, the image is output to a memory, e.g., part of the memory system 736, for direct output to a drum-imaging device. The drum output device in such a case is the output device shown as 708 in FIG. 7.

An embodiment of the invention also may be provided in the form of a carrier medium carrying computer readable code segments that cause one or more processors of a processing system such as shown in FIG. 7 to implement one or more of the method embodiments described herein. One example of such a carrier medium is a computer software product. The software may be provided in one of many forms, e.g., a CD-ROM, a magnetic medium, and so forth. Such software may be loaded into the storage of the computer system. In FIG. 7, software 706 in mass storage 742 is such a set of computer readable code segments.

Various modifications are possible. For example, in the dot displacement embodiment, various types of displacements are possible in the region close to the seam. Furthermore, while an embodiment is described that includes displacing the halftone dots in the bottom of the image in the circumferential direction, in an alternate embodiment, the top of the image is modified while the halftone dots in the bottom area are not displaced.

In step 805 of the image size reduction embodiment, the image is cut at the lowest edge in the circumferential direction so that the image size in the circumferential direction is an integral number of screen cells. Alternate embodiments cut the image at another location or at more than one location such that the image size in the circumferential direction is an integral number of screen cells.

Note also that while the embodiments described herein are for an external drum scanner, other configurations also are possible.

Note also while methods are described above that involve modifications in a top area and a bottom area in the neighborhoods of the upper and lower edges of the image, those in the art will understand that these methods are equally applicable to the left and right edges, respectively, so that in the description above and in the claims, top and bottom can be interpreted as opposite edges, e.g., upper and lower edges or left and right edges.

Thus, while some embodiments of the invention have been described herein, those skilled in the art will recognize that modifications may be made without departing from the spirit of the invention, and it is intended that all such modifications shall fall within the scope of the invention which is to be limited only by the claims.

What is claimed is:

1. A method comprising:
   accepting image data of a screened image for repeated reproduction along a circumferential direction of a drum imager, the screening of the screened image using a tiled supercell, such that the image has a seam between the upper and lower edges of the image, upper to lower being defined in the circumferential direction;
   determining the period of the supercell in the circumferential direction; and
   cutting the image in the region of the seam to reduce the size of the image in the circumferential direction to an integral number of supercell periods.

2. A method as recited in claim 1, further comprising:
   enlarging the reduced image in the circumferential direction to restore the original image size.

3. A method as recited in claim 1, wherein the image is for output on a drum scanner on a sleeve or roller, the method further comprising:
   modifying the sleeve or roller to have a circumference that matches the reduced image in the circumferential direction.

4. A method as recited in claim 1, further comprising:
   determining the period of the supercell in the axial direction; and
   reducing the size of the image in the axial direction to an integral number of supercell periods.

5. A method as recited in claim 4, further comprising:
   enlarging the reduced image in the circumferential direction to restore the original image size in the circumferential direction; and
   enlarging the reduced image in the axial direction to restore the original image size in the axial direction.

6. A method comprising:
   accepting image data of a screened image for repeated reproduction along a circumferential direction, of a cylindrical form;
   analyzing the image in a neighborhood of the seam between an upper and lower edge of the image to determine any screening mismatch between the upper and lower edge of the image, upper to lower being defined in the circumferential direction; and modifying the position of halftone dots in the neighborhood to eliminate the screening mismatch at the seam.

7. A method as recited in claim 6, wherein the neighborhood consists of a top part and a bottom part, wherein the analyzing includes:

searching for an area that exists in both the top and bottom parts area and wherein there is a well-defined halftone screen of which one or more parameters are known or determined;

carrying out screen estimation in the area that exists in both the top and bottom parts;

determining the displacement that would cause the screens to line up at the seam, and wherein the position modifying includes:

displacing the pixels of the neighborhood to cause a total relative displacement at the seam equal to the determined displacement, and such that there is no displacement at the borders of the neighborhood parts away from the seam.

8. A method as recited in claim 7, wherein the pixel displacement occurs in both the top and the bottom parts, and wherein the pixels are displaced by amounts that vary inversely to their respective distance from the seam in the circumferential direction, such that the further a particular pixel is from the seam, the less the amount of displacing.

9. A method as recited in claim 7, determining the displacement that would cause the screens to line up at the seam includes carrying out a cross-correlation operation to the top and bottom parts to determine a displacement that produces a peak in the correlation indicative of a match.

10. A method as recited in claim 6, wherein the neighborhood consists of a top part and a bottom part, and wherein the analyzing includes:

determining the centers of the halftone dots and the screen angle of the screen in each of the areas of the neighborhood; and forming a line joining halftone dots at the screen angle in each of the top area and a bottom area of the neighborhood.

11. A method as recited in claim 10, wherein the modifying of the position of halftone dots is such that in one area of the neighborhood, the dots are displaced by amounts that are inversely to their respective distance from the seam in the circumferential direction, such that the further a particular pixel is from the seam, the less amount of displacing, while the positions of the halftone dots in the other area remain fixed.

12. A method as recited in claim 10, wherein the halftone dot position modifying moves the halftone dots such that the line joining the halftone dots retains smoothness.

13. A method as recited in claim 10, wherein the halftone dot position modifying displaces dots in one area while the halftone dots in the other area remain fixed.

14. A method as recited in claim 6, further comprising:

repairing each partial halftone dot that is originally located at the edge of the image that becomes whole after displacement.

15. A method as recited in claim 14, wherein the repairing of a halftone dot includes determining the average gray level in a region surrounding the halftone dot and adding pixels to the halftone dot to increase its area such that the halftone dot size matches the average gray level of the region.

16. A method as recited in claim 6, wherein the neighborhood is small compared to the total size of the image in the circumferential direction.

17. A method as recited in claim 6, wherein the neighborhood is a significant part of the image, such that that the halftone dot displacement occurs in at least approximately half the image.

18. A method as recited in claim 6, wherein the neighborhood is substantially equal to the total image, such that the halftone dot position modifies the screen angle of the screen.

19. An apparatus comprising:

means for accepting image data of a screened image for repeated reproduction along a circumferential direction of a drum imager, the screening using a tiled supercell, such that the image has a seam between the upper and lower edges of the image, upper to lower being defined in the circumferential direction 1;

means for determining the period of the supercell in the circumferential direction;

means for cutting the image in the region of the seam to reduce the size of the image in the circumferential direction to an integral number of supercell periods; and means to output the reduced image data.

20. An apparatus as recited in claim 19, further comprising:

means to enlarge the reduced image in the circumferential direction to restore the original image size.

21. An apparatus to modify a screened image for repeated reproduction along a circumferential direction, the screening using a tiled supercell, the apparatus comprising a processing system including a processor programmed to determine the period of the supercell in the circumferential direction and to reduce the size of the image in the circumferential direction to an integral number of supercell periods.

22. An apparatus as recited in claim 21, wherein the processor is further programmed to enlarge the reduced image in the circumferential direction to restore the original image size.

23. An apparatus comprising:

means for accepting image data of a screened image for repeated reproduction along a circumferential direction of a drum imager;

means for analyzing the image in a neighborhood of the seam between upper and lower edge of the image to determine any screening mismatch between the upper and lower edge of the image; and means for modifying the position of halftone dots in the neighborhood to eliminate the screening mismatch at the seam.

24. An apparatus to modify a screened image for repeated reproduction along a circumferential direction, the apparatus comprising a processing system including a processor programmed to accept image data of a screened image for repeated reproduction along a circumferential direction of a drum imager; analyze the image in a neighborhood of the seam between upper and lower edge of the image to determine any screening mismatch between the upper and lower edge of the image, and to modify the position of halftone dots in the neighborhood to eliminate the screening mismatch at the seam.

25. A tangible computer-readable medium having one or more computer readable code segments encoded thereon that when executed by one or more processors of a processing system cause carrying out a method of modifying a screened image for repeated reproduction along a circumferential direction of a drum imager, the screening using a tiled supercell, the method comprising:

accepting image data of the screened image for repeated reproduction along the circumferential direction of a drum imager, the screening of the screened image using a tiled super cell, such that the image has a seam between the upper and lower edges of the image, upper to lower being defined in the circumferential direction;

determining the period of the supercell in the circumferential direction; and cutting the image in the region of the seam to reduce the size of the image in the circumferential direction to an integral number of supercell periods.

26. A tangible computer-readable medium as recited in claim 25, the method further comprising:

enlarging the reduced image in the circumferential direction to restore the original image size.

27. A tangible computer-readable medium having one or more computer readable code segments encoded thereon that when executed by one or more processors of a processing system cause carrying out a method of modifying a screened image for repeated reproduction along a circumferential direction of a drum imager, the method comprising:

accepting image data of the screened image for repeated reproduction along the circumferential direction of the drum imager;

analyzing the image in a neighborhood of the seam between upper and lower edge of the image to determine any screening mismatch between the upper and lower edge of the image; and modifying the position of halftone dots in the neighborhood to eliminate the screening mismatch at the seam.

* * * * *

UNITED STATES PATENT AND TRADEMARK OFFICE
CERTIFICATE OF CORRECTION

PATENT NO. : 7,394,570 B2
APPLICATION NO. : 10/442682
DATED : July 1, 2008
INVENTOR(S) : Klein et al.

It is certified that error appears in the above-identified patent and that said Letters Patent is hereby corrected as shown below:

In column 5, line 8, kindly replace "the superceilperiod" with --the supercell period--

In column 9, lines 53-55, kindly replace "A method as recited in claim 10, wherein the halftone dot position modifying displaces dots in one area while the halftone dots in the other area remain fixed." with
--A method as recited in claim 6, further comprising:
    repairing each partial halftone dot that is originally located at the edge of the image that becomes whole after displacement.--

In column 9, lines 56-59, kindly replace "A method as recited in claim 6, further comprising:
repairing each partial halftone dot that is originally located at the edge of the image that becomes whole after displacement." with --A method as recited in claim 13, wherein the repairing of a halftone dot includes determining the average gray level in a region surrounding the halftone dot and adding pixels to the halftone dot to increase its area such that the halftone dot size matches the average gray level of the region.--

In column 9, lines 60-64, kindly replace "A method as recited in claim 14, wherein the repairing of a halftone dot includes determining the average gray level in a region surrounding the halftone dot and adding pixels to the halftone dot to increase its area such that the halftone dot size matches the average gray level of the region." with --A method as recited in claim 10, wherein the halftone dot position modifying displaces dots in one area while the halftone dots in the other area remain fixed.--

Signed and Sealed this

Eleventh Day of May, 2010

David J. Kappos
*Director of the United States Patent and Trademark Office*